(12) United States Patent
Cheng et al.

(10) Patent No.: US 9,368,343 B1
(45) Date of Patent: Jun. 14, 2016

(54) REDUCED EXTERNAL RESISTANCE FINFET DEVICE

(71) Applicant: International Business Machines Corporation, Armonk, NY (US)

(72) Inventors: Kangguo Cheng, Schenectady, NY (US); Shom S. Ponoth, Los Angeles, CA (US); Raghavasimhan Sreenivasan, Schenectady, NY (US); Theodorus E. Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/591,041

(22) Filed: Jan. 7, 2015

(51) Int. Cl.
| | | |
|---|---|---|
| *H01L 21/02* | (2006.01) | |
| *H01L 29/66* | (2006.01) | |
| *H01L 29/161* | (2006.01) | |
| *H01L 29/78* | (2006.01) | |

(52) U.S. Cl.
CPC ........ *H01L 21/02532* (2013.01); *H01L 29/161* (2013.01); *H01L 29/66553* (2013.01); *H01L 29/66795* (2013.01); *H01L 29/785* (2013.01)

(58) Field of Classification Search
CPC .................................................. H01L 29/785
See application file for complete search history.

(56) References Cited

U.S. PATENT DOCUMENTS

| | | | |
|---|---|---|---|
| 6,699,763 B2 | 3/2004 | Grider et al. | |
| 8,114,727 B2 | 2/2012 | Xiong et al. | |
| 8,664,058 B2 | 3/2014 | Bedell et al. | |
| 8,835,232 B2 | 9/2014 | Jagannathan et al. | |
| 9,153,695 B2 * | 10/2015 | Huang | ............ H01L 21/823807 |
| 2012/0202328 A1 | 8/2012 | Lu et al. | |
| 2013/0009251 A1 | 1/2013 | Jain | |
| 2013/0154007 A1 | 6/2013 | Cheng et al. | |
| 2013/0224925 A1 | 8/2013 | Oh et al. | |
| 2013/0248949 A1 | 9/2013 | Kirkpatrick et al. | |
| 2014/0134818 A1 * | 5/2014 | Cheng | ............... H01L 29/66636 438/300 |

* cited by examiner

*Primary Examiner* — Mamadou Diallo
(74) *Attorney, Agent, or Firm* — Steven Meyers; Hoffman Warnick LLC (57) ABSTRACT

The present invention relates generally to semiconductor devices, and more particularly, to a structure and method of reducing external resistance within fin field effect transistor (finFET) devices. A first spacer and a second spacer may be formed adjacent to a gate which may reduce capacitance in a substantial portion of a epitaxial source-drain region while also permitting a portion of the epitaxial source-drain region to be located close to a channel. By reducing capacitance from the gate on the substantial portion of the epitaxial source-drain region, resistance in the epitaxial source-drain region may be reduced which may result in increased device performance.

19 Claims, 10 Drawing Sheets

REDUCED EXTERNAL RESISTANCE FINFET DEVICE

BACKGROUND

The present invention relates generally to semiconductor devices, and more particularly, to a structure and method for forming a fin field effect transistor (finFET) device having a low external resistance.

FinFET devices have been proposed to enable continued scaling of complementary metal oxide semiconductor (CMOS) technology at under 20 nm gate lengths. As the dimensions within finFET devices become ever smaller, undesirable parasitic effects such as capacitance from a gate to a source-drain and parasitic resistance in the source-drain may severely impact the performance of finFET devices.

SUMMARY

According to an embodiment, a method is disclosed. The method may include: forming an epitaxial source-drain region around a fin, the epitaxial source-drain region having a first epitaxial layer adjacent to and contacting a sidewall of a first spacer and below a second spacer and a second epitaxial layer on the first epitaxial layer adjacent to and contacting a sidewall of the second spacer, wherein the first spacer is adjacent to and contacting a sidewall of a gate.

According to another embodiment, a method is disclosed. The method may include: forming a fin on an upper surface of a substrate; forming a gate around the fin, wherein the gate is orthogonal to a length of the fin; forming a first spacer around the fin adjacent to and contacting a sidewall of the gate; forming a first epitaxial layer around the fin adjacent to and contacting a sidewall of the first spacer, the first epitaxial layer having an upper surface below an upper surface of the first spacer; forming a second spacer around the first epitaxial layer adjacent to and contacting a sidewall of the first spacer, the second spacer having a bottom surface in contact with an upper surface of the first epitaxial layer; and forming a second epitaxial layer around the first epitaxial layer adjacent to and contacting a sidewall of the second spacer.

According to an embodiment, a structure is disclosed. The structure may include: a fin on an upper surface of a substrate; a gate around the fin, wherein the gate is orthogonal to a length of the fin; a first spacer around the fin adjacent to and contacting a sidewall of the gate; a first epitaxial layer around the fin adjacent to and contacting a sidewall of the first spacer, the first epitaxial layer having an upper surface below an upper surface of the first spacer; a second spacer around the first epitaxial layer adjacent to and contacting a sidewall of the first spacer, the second spacer having a bottom surface in contact with an upper surface of the first epitaxial layer; and a second epitaxial layer around the first epitaxial layer adjacent to and contacting a sidewall of the second spacer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The terms "epitaxial growth and/or deposition" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. Selective epitaxy is a local growth of a epitaxial layer that is generally accomplished by using a patterned mask to prevent material from depositing in certain areas covered by the patterned mask while permitting the material to deposit in areas not covered by the patterned mask. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. The temperature for epitaxial deposition typically ranges from 550° C. to 900° C. Although higher temperature typically results in faster deposition, the faster deposition may result in crystal defects and film cracking.

The present invention relates generally to semiconductor devices and more particularly, to a structure and method for forming a fin field effect transistor (finFET) device having a low external resistance. In conventional finFET devices, a epitaxial source-drain region may be formed as close to the channel as may be possible without degrading a junction gradient. However, a epitaxial source-drain region formed close to a channel has the disadvantage of capacitance from a gate which may cause resistance within the epitaxial source-drain region. Resistance within the epitaxial source-drain region may reduce current through the channel, which may reduce device performance.

To form a epitaxial source-drain region as close as possible to the channel while minimizing the effect of capacitance from the gate upon the epitaxial source-drain region, embodiments of the present invention may utilize a second spacer formed adjacent to a first spacer which may reduce capacitance in a substantial portion of the epitaxial source-drain region. More specifically, the finFET device may include a epitaxial source-drain region composed of a first epitaxial layer and a second epitaxial layer. The first epitaxial layer may form a lower portion of the epitaxial source-drain region, and the second epitaxial layer may form a upper portion of the epitaxial source-drain region. A portion of the first epitaxial layer may be under the second spacer and adjacent to the first spacer so that the first epitaxial layer may be as close to the channel as possible. The second spacer may shield the epitaxial source-drain region from capacitance from the gate so that external resistance within the epitaxial source-drain region may be reduced. By reducing capacitance from the gate to a substantial portion of the epitaxial source-drain region, resistance in the epitaxial source-drain region may be reduced which may result in increased device performance. A method of reducing external resistance caused by capacitance from a gate is described below with reference to FIGS. 1A-5B.

Figure 1A:
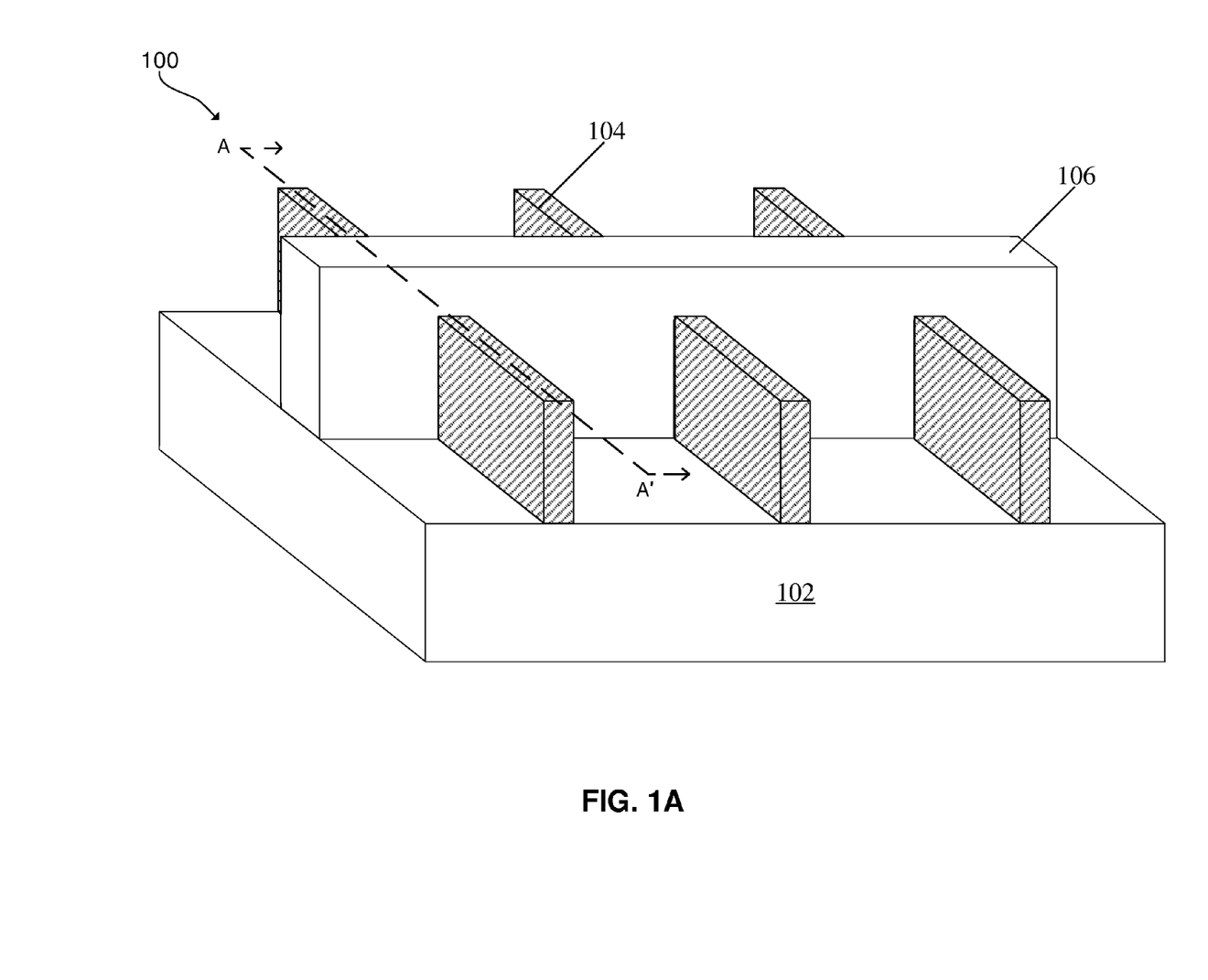
FIG. 1A is an isometric view illustrating a structure, according to an embodiment of the present invention.

Referring now to FIG. 1A, an isometric view of a finFET 100 is shown. In an embodiment, the finFET 100 may be comprised of one or more fins 104 (hereinafter "fins") on an upper surface of an insulating layer 102. The fins 104 may be composed of a semiconducting material, such as, for example, silicon. The insulating layer 102 may be composed of an electrically insulating material, such as, for example, silicon dioxide. The finFET 100 may also include a gate 106 on the upper surface of the insulating layer 102 which may be oriented perpendicularly to the fins 104. The gate 106 may be composed of one or more layers of conducting materials which may include, for example, polycrystalline silicon or ruthenium oxide. The gate 106 may have a height greater than the fins 104. The gate 106 may be formed around the fins 104 so that the gate 106 may be in contact with a first sidewall, a second sidewall (hereinafter "sidewalls"), and a top of the fins 104.

Figure 1B:
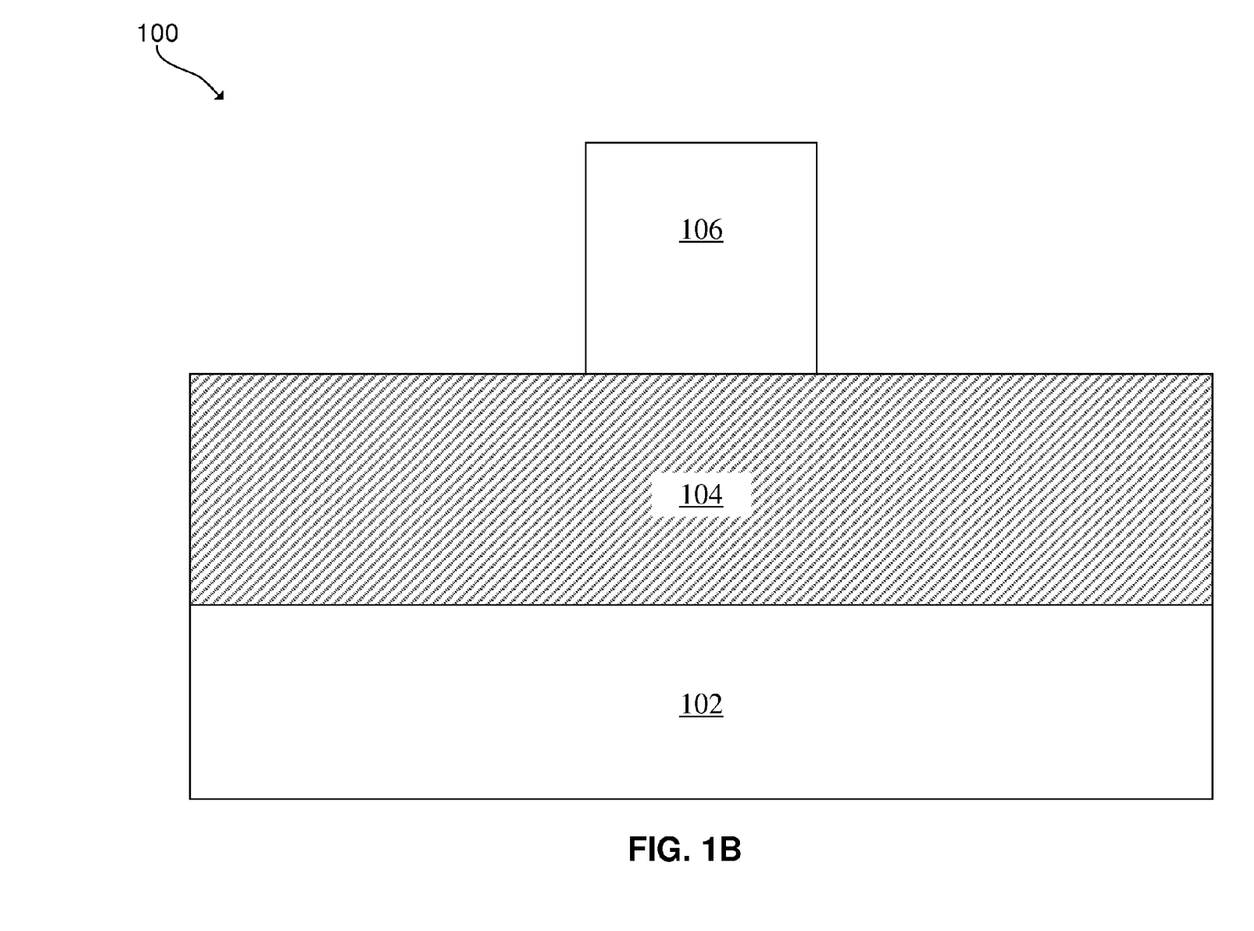
FIG. 1B is a cross section view of the structure shown in FIG. 1A taken along a section line A-A', according to an embodiment of the present invention.

Referring now to FIG. 1B, a cross section view of the finFET 100 taken along a section line A-A' (FIG. 1A) is shown. In an embodiment, the finFET 100 may be comprised of the fins 104 on the upper surface of the insulating layer 102. The finFET 100 may also include the gate 106 on the fins 104. Since the section line A-A' (FIG. 1A) is located along the fins 104, only a top portion of the gate 106 located above the fins 104 is visible in the cross section view. The gate 106 may be formed around the fin 104 so that the gate 106 may in contact with the sidewalls (not shown) and the top of the fins 104.

Figure 2A:
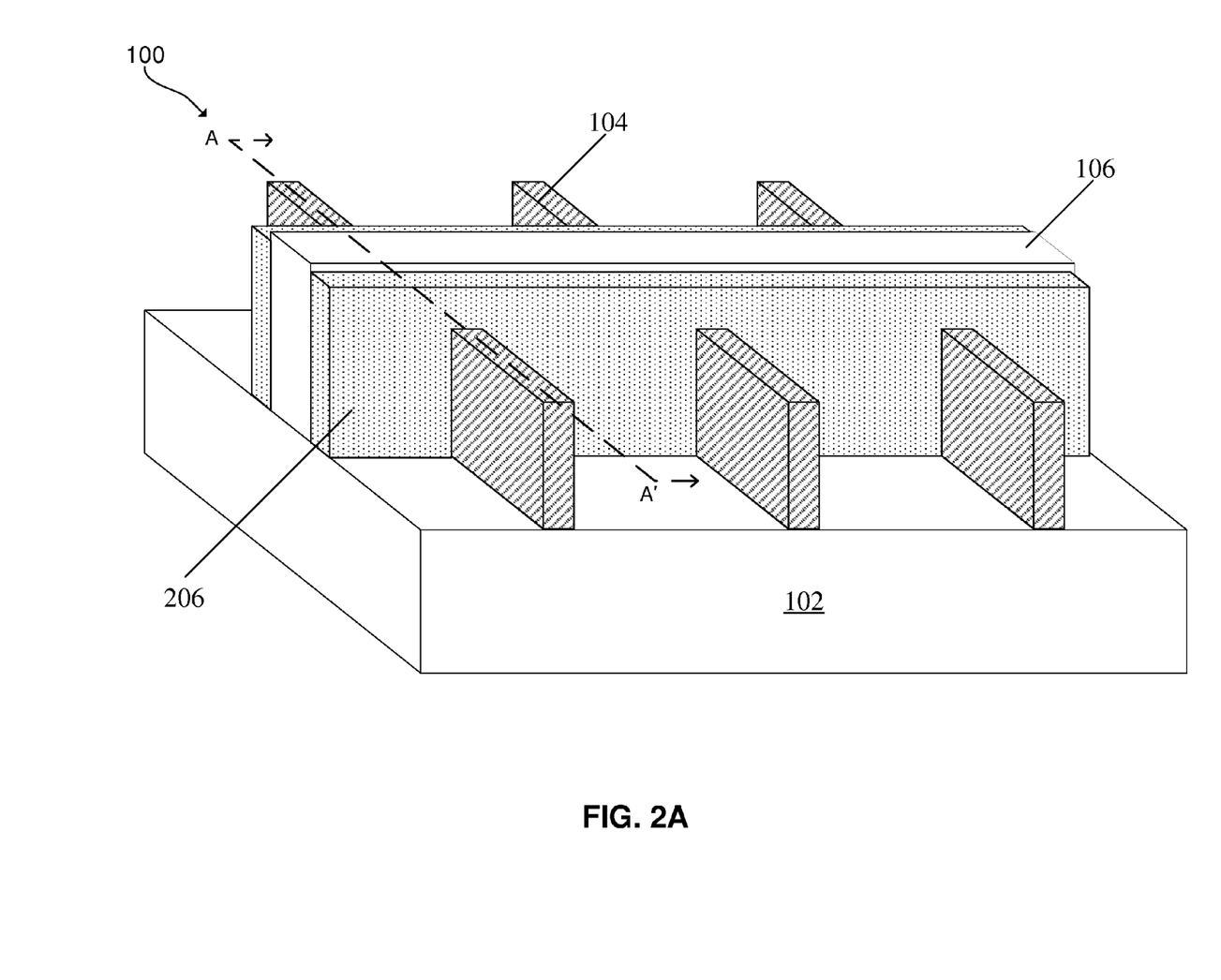
FIG. 2A is an isometric view illustrating forming a first spacer, according to an embodiment of the present invention.

Referring now to FIG. 2A, an isometric view illustrating forming a first spacer 206 is shown. In an embodiment, the first spacer 206 may be adjacent to and contacting a sidewall of the gate 106. The first spacer 206 may be formed around the fins 104 so that the first spacer 206 may be in contact with the sidewalls and top of the fins 104. The first spacer 206 may be formed using a conventional deposition technique, such as, for example, chemical vapor deposition (CVD), physical vapor deposition (PVD), plasma enhanced CVD (PECVD), molecular beam deposition (MBD), pulsed laser deposition (PLD), liquid source misted chemical deposition (LSMCD), or spin on deposition. In a preferred embodiment, the first spacer 206 may be formed using atomic layer deposition (ALD). The first spacer 206 may be composed of a dielectric material, such as, for example, silicon oxide or silicon nitride. The first spacer 206 may have a thickness ranging from approximately 3 nm to approximately 7 nm. The thickness of the first spacer 206 and use of a dielectric material within the first spacer 206 may reduce a capacitance from the gate 106 to a epitaxial source-drain region formed in subsequent processing steps.

Figure 2B:
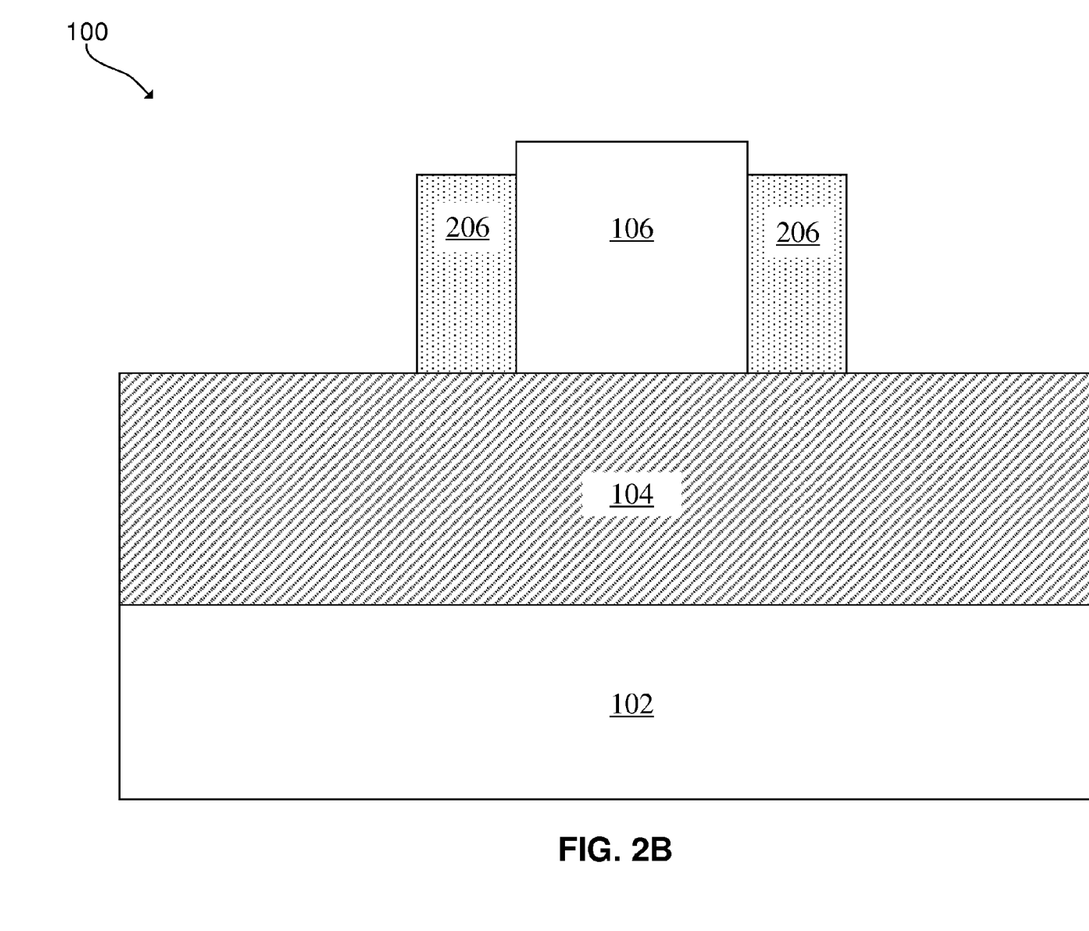
FIG. 2B is a cross section view of the structure shown in FIG. 2A taken along the section line A-A', according to an embodiment of the present invention.

Referring now to FIG. 2B, a cross section view illustrating forming the first spacer 206 along the section line A-A' (FIG. 2A) is shown. In an embodiment, the first spacer 206 may be adjacent to and contacting the sidewall of the gate 106. Since the section line A-A' (FIG. 2A) is located along the fins 104, only a top portion of the first spacer 206 located above the fins 104 is visible in the cross section view. The first spacer 206 may be formed around the fins 104 so that the first spacer 206 may be in contact with the sidewalls (not shown) and top of the fins 104.

Figure 3A:
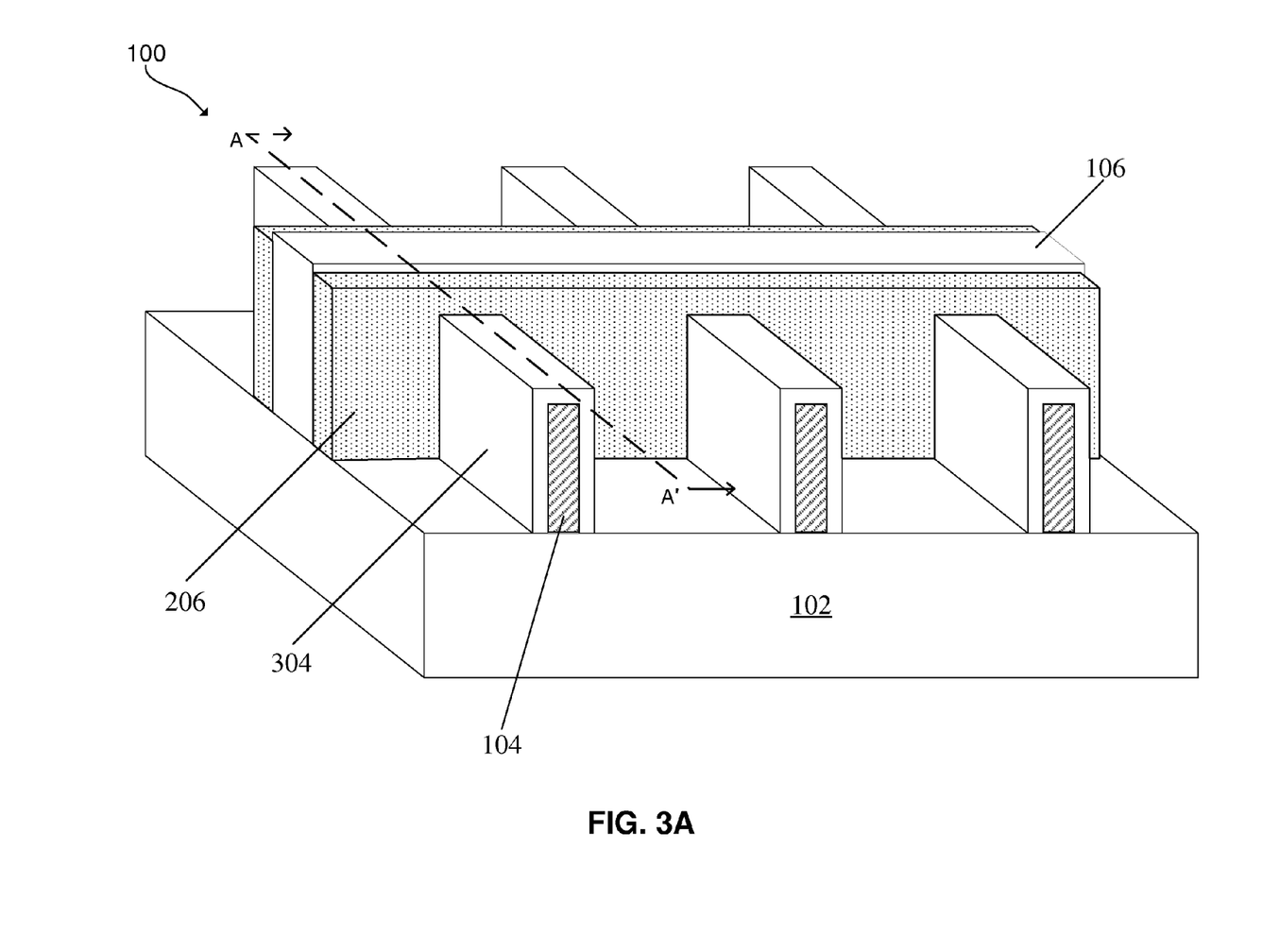
FIG. 3A is an isometric view illustrating forming a first epitaxial layer, according to an embodiment of the present invention.

Referring now to FIG. 3A, an isometric view illustrating forming a first epitaxial layer 304 on the fins 104 adjacent to and contacting a sidewall of the first spacer 206 is shown. The first epitaxial layer 304 may be formed conformally around the fins 104. The first epitaxial layer 304 may be in contact with the sidewalls and top of the fins 104. The first epitaxial layer 304 may be formed using a conventional deposition process known in the art, such as, for example, rapid thermal chemical vapor deposition (RTCVD), low-energy plasma deposition (LEPD), ultra-high vacuum chemical vapor deposition (UHVCVD), or atmospheric pressure chemical vapor deposition (APCVD). In a preferred embodiment, the first epitaxial layer 304 may be formed using a conventional epitaxial deposition process, such as molecular beam epitaxy (MBE). The first epitaxial layer 304 may comprise silicon germanium with a germanium concentration ranging from approximately 0 atomic percent to approximately 80 atomic percent. The first epitaxial layer 304 may have a thickness ranging from approximately 3 nm to approximately 7 nm. In a preferred embodiment, the first epitaxial layer may have a thickness of approximately 5 nm.

Figure 3B:
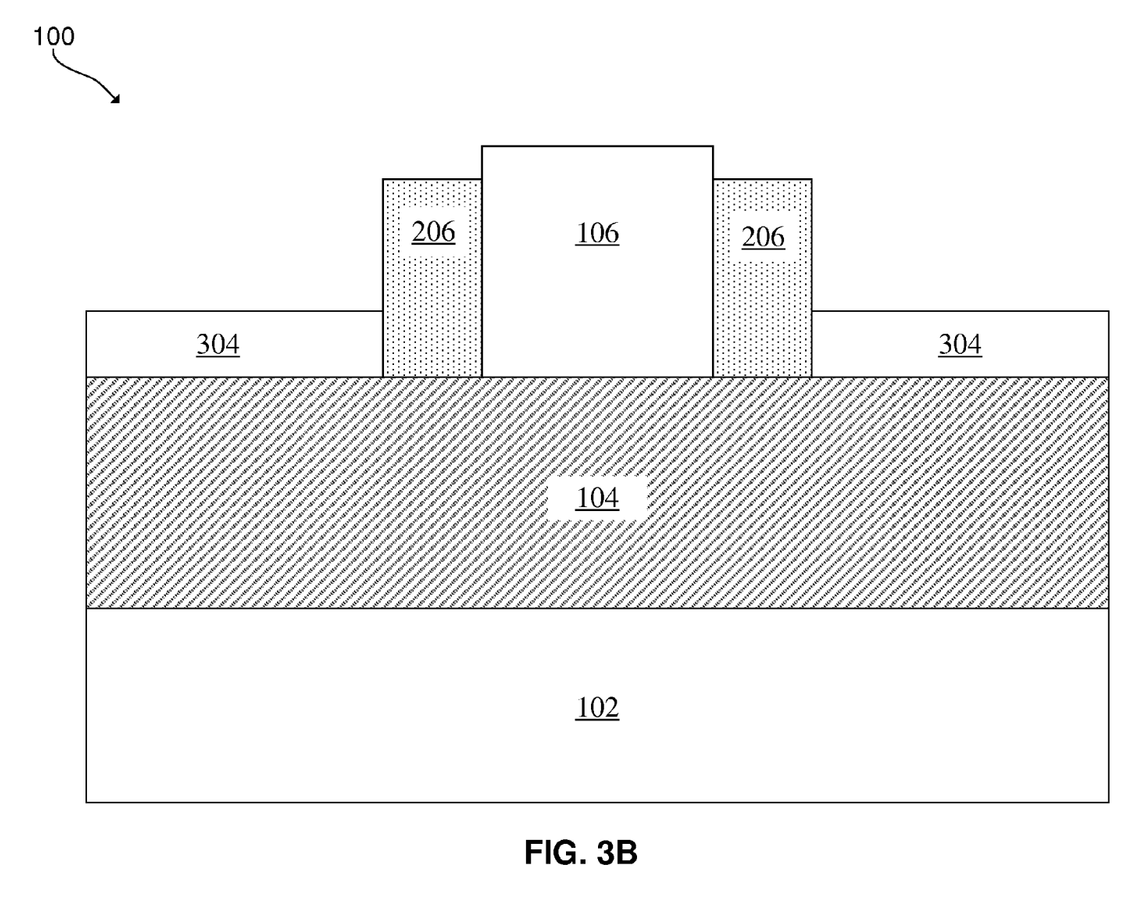
FIG. 3B is a cross section view of the structure shown in FIG. 3A taken along the section line A-A', according to an embodiment of the present invention.

Referring now to FIG. 3B, a cross section view illustrating forming the first epitaxial layer 304 taken along the section line A-A' (FIG. 3A) is shown. Since the section line A-A' (FIG. 2A) is located along the fins 104, only a top portion of the first epitaxial layer 304 located above the fins 104 is visible in the cross section view. The first epitaxial layer 304 may be formed around the fins 104 so that the first epitaxial layer 304 is in contact with the sidewalls (not shown) and top of the fins 104. A sidewall of the first epitaxial layer 304 nearest to the gate 106 may be adjacent to and contacting the first spacer 206.

Figure 4A:
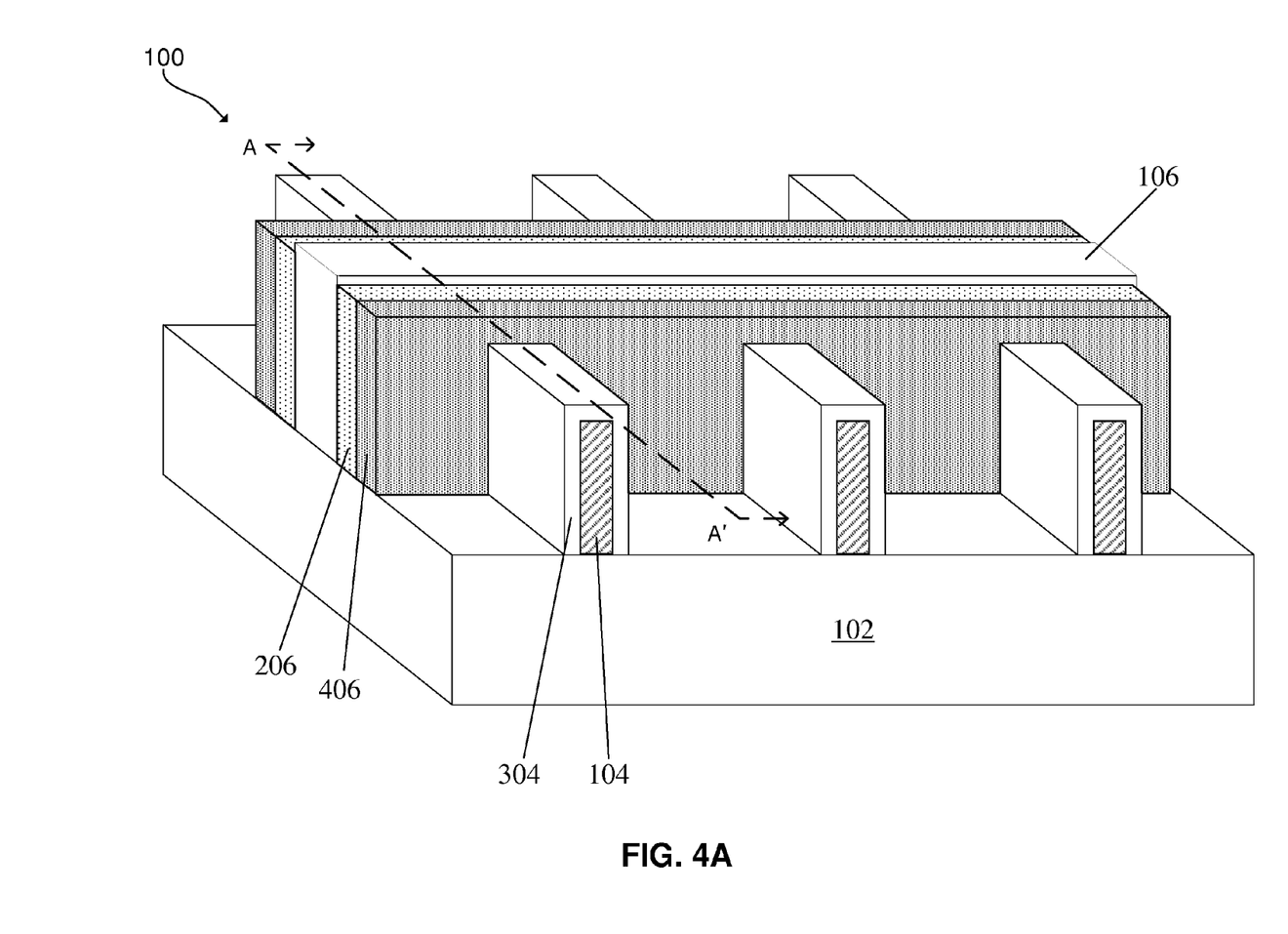
FIG. 4A is an isometric view illustrating forming a second spacer, according to an embodiment of the present invention.

Referring now to FIG. 4A, an isometric view illustrating forming a second spacer 406 on the first epitaxial layer 304 is shown. In an embodiment, the second spacer 406 may be adjacent to and contacting a sidewall of the first spacer 206. The second spacer 406 may be formed around the first epitaxial layer 304 so that the second spacer is in contact with a first sidewall, second sidewall (hereinafter "sidewalls") and top of the first epitaxial layer 304. The second spacer 406 may be formed using a conventional deposition technique, such as, for example, CVD, PVD, PECVD, MBD, PLD, LSMCD, or spin on deposition. In a preferred embodiment, the second spacer 406 may be formed using ALD. The second spacer 406 may be composed of a dielectric material, such as, for example, silicon oxide or silicon nitride. The second spacer 406 may have a thickness ranging from approximately 3 nm to approximately 7 nm. The thickness and composition of the second spacer 406 may reduce a capacitance from the gate 106 to a epitaxial source-drain region composed of the first epitaxial layer 304 and an additional layer formed in subsequent processing steps.

Figure 4B:
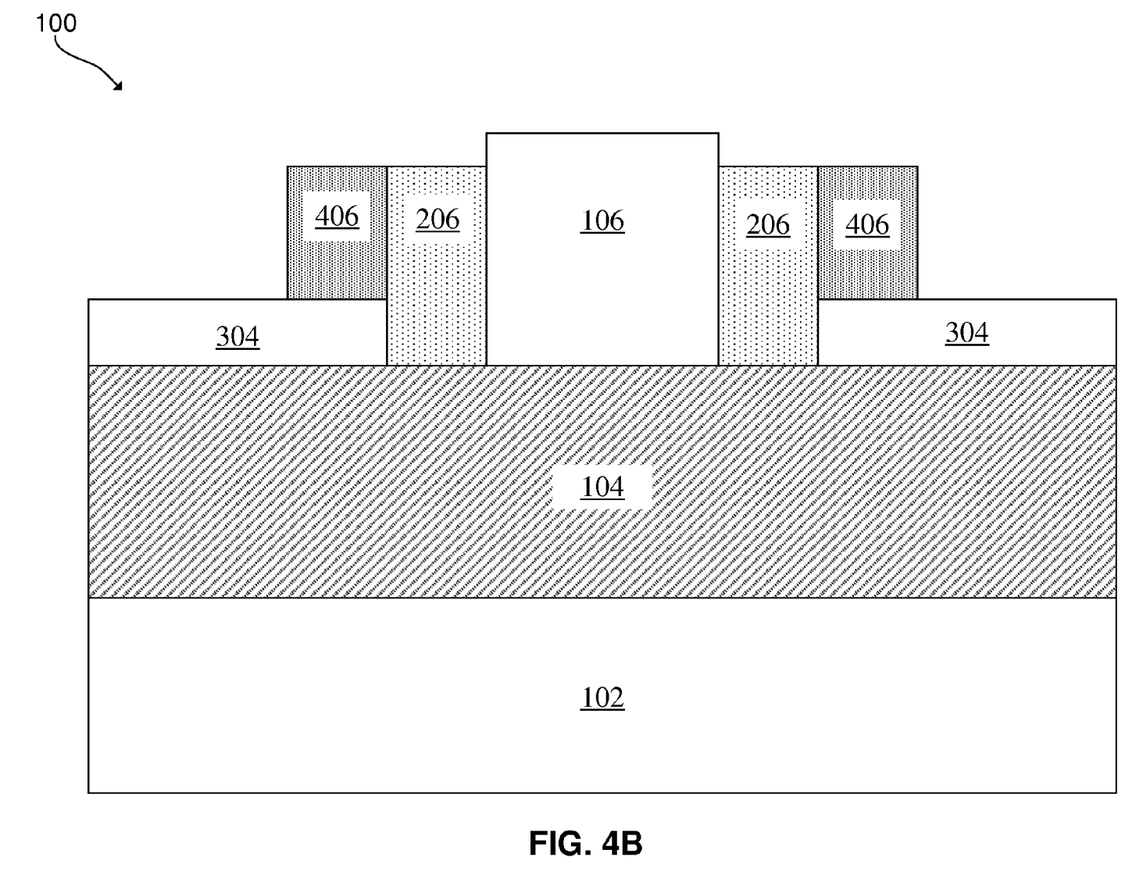
FIG. 4B is a cross section view of the structure shown in FIG. 4A taken along the section line A-A', according to an embodiment of the present invention.

Referring now to FIG. 4B, a cross section view illustrating forming the second spacer 406 taken along a section line A-A' (FIG. 4A) is shown. In an embodiment, the second spacer 406 may be formed on the first epitaxial layer 304 and may be adjacent to and contacting a sidewall of the first spacer 206. Since the section line A-A' (FIG. 2A) is located along the fins 104, only a portion of the second spacer 406 above the first epitaxial layer 304 is visible in the cross section view. The second spacer 406 may be formed around the first epitaxial layer 304 so that the second spacer 406 is in contact with the sidewalls and top of the first epitaxial layer 304.

Figure 5A:
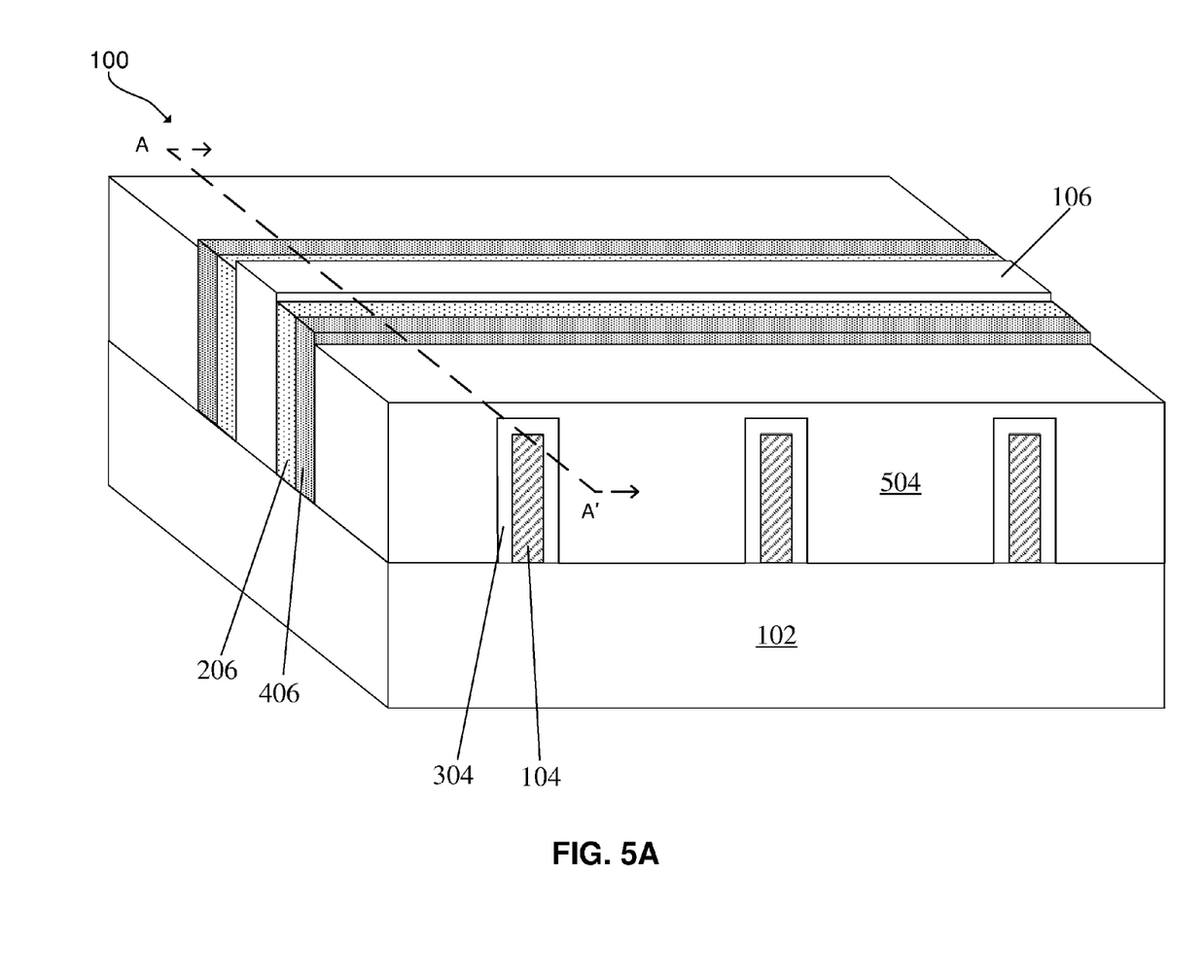
FIG. 5A is an isometric view illustrating forming a second epitaxial layer, according to an embodiment of the present invention.

Referring now to FIG. 5A, an isometric view illustrating forming a second epitaxial layer 504 is shown. The second epitaxial layer 504 may be formed on the insulating layer 102 and around the first epitaxial layer 304. The second epitaxial layer 504 may be formed around the first epitaxial layer 304 such that the second epitaxial layer 504 may be in contact with the sidewalls and top of the first epitaxial layer 304. The second epitaxial layer 504 may be formed using a conventional deposition process known in the art, such as, for example, RTCVD, LEPD, UHVCVD, or APCVD. In a preferred embodiment, the second epitaxial layer 504 may be formed using a conventional epitaxial deposition process, such as MBE. The second epitaxial layer 504 may comprise silicon germanium with a germanium concentration ranging from approximately 0 atomic percent to approximately 80 atomic percent. A portion of the second epitaxial layer 504 above the first epitaxial layer 304 may have a thickness ranging from approximately 3 nm to approximately 7 nm. In a preferred embodiment, the portion of the second epitaxial layer 504 above the first epitaxial layer 304 may have a thickness of approximately 5 nm.

Figure 5B:
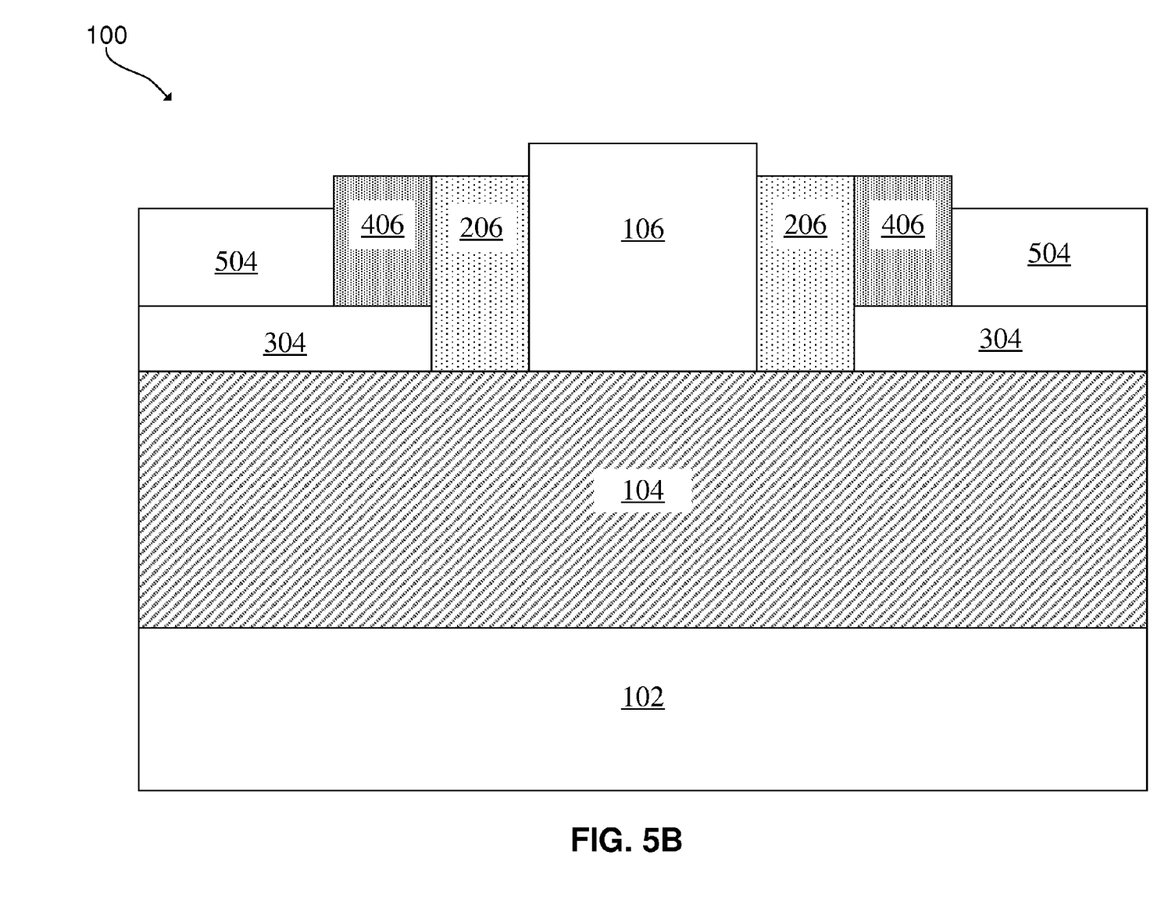
FIG. 5B is a cross section view of the structure shown in FIG. 5A taken along the section line A-A', according to an embodiment of the present invention.

Referring now to FIG. 5B, a cross section view illustrating forming the second epitaxial layer 504 taken along a section line A-A' (FIG. 5A) is shown. Since the section line A-A' (FIG. 1A) is located along the fins 104, only a top portion of the second epitaxial layer 504 located above the fins 104 is visible in the cross section view. A portion of the second epitaxial layer 504 may be formed on the insulating layer 102. The second epitaxial layer 504 may be formed around the first epitaxial layer 304 so that the second epitaxial layer 504 is in contact with the sidewalls (not shown) and top of the first epitaxial layer 304.

The present invention permits a epitaxial source-drain region to be formed close to a channel while also shielding a substantial portion of the epitaxial source-drain region from capacitance from the gate. Since a portion of the epitaxial source-drain region may be formed near to the channel, resistance in the region between the epitaxial source-drain region and channel may be minimized. In addition, by forming a second spacer, capacitance from the gate to the epitaxial source-drain region may be reduced compared to a conventional single spacer configuration. By reducing capacitance on the epitaxial source-drain region, external resistance upon the epitaxial source-drain region in the present invention may be less than the external resistance upon a epitaxial source-drain region in conventional finFET devises. Thus, the present invention has the advantage of the epitaxial source-drain region formed near a channel as well as the first spacer and the second spacer to shield the epitaxial source-drain region from capacitance from the gate to minimize resistance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming an epitaxial source-drain region around a fin, the epitaxial source-drain region having a first epitaxial layer adjacent to and contacting a sidewall of a first spacer and below a second spacer and a second epitaxial layer on the first epitaxial layer adjacent to and contacting a sidewall of the second spacer, wherein the first spacer is adjacent to and contacting a sidewall of a gate,
   wherein the second epitaxial layer is formed on an upper surface of a substrate and around the first epitaxial layer.

2. The method of claim 1, wherein the first spacer is formed on an upper surface of a substrate and around the fin.

3. The method of claim 1, wherein the first epitaxial layer is formed on an upper surface of a substrate and around the fin.

4. The method of claim 1, wherein the second spacer is formed on an upper surface of a substrate and around the first epitaxial layer.

5. The method of claim 1, wherein the forming the epitaxial source-drain region around the fin comprises a epitaxial growth of silicon germanium.

6. The method of claim 1, wherein the first epitaxial layer is formed conformally around the fin.

7. The method of claim 1, wherein the second epitaxial layer has a thickness ranging from approximately 3 nm to approximately 7 nm above an upper surface of the first epitaxial layer.

8. A method comprising:
forming a fin on an upper surface of a substrate;
forming a gate around the fin, wherein the gate is orthogonal to a length of the fin;
forming a first spacer around the fin adjacent to and contacting a sidewall of the gate;
forming a first epitaxial layer around the fin adjacent to and contacting a sidewall of the first spacer, the first epitaxial layer having an upper surface below an upper surface of the first spacer;
forming a second spacer around the first epitaxial layer adjacent to and contacting a sidewall of the first spacer, the second spacer having a bottom surface in contact with an upper surface of the first epitaxial layer; and
forming a second epitaxial layer on an upper surface of a substrate and around the first epitaxial layer adjacent to and contacting a sidewall of the second spacer.

9. The method of claim 8, wherein the forming the first spacer comprises:
depositing a dielectric material on the upper surface of the substrate and around the fin.

10. The method of claim 8, wherein the first epitaxial layer and the second epitaxial layer comprise an epitaxial source-drain region.

11. The method of claim 10, wherein the epitaxial source-drain region comprises silicon germanium with a germanium concentration ranging from approximately 0 atomic percent to approximately 80 atomic percent.

12. The method of claim 8, wherein the forming the first epitaxial layer comprises: conformally growing silicon germanium on the fin using epitaxy.

13. The method of claim 8, wherein the forming the second spacer comprises:
depositing a dielectric material on the upper surface of the substrate and around the first epitaxial layer.

14. The method of claim 8, wherein the forming the second epitaxial layer comprises:
growing silicon germanium on the first epitaxial layer using epitaxy such that the second epitaxial layer has a thickness ranging from approximately 3 nm to approximately 7 nm above an upper surface of the first epitaxial layer.

15. A structure comprising:
a fin on an upper surface of a substrate;
a gate around the fin, wherein the gate is orthogonal to a length of the fin;
a first spacer around the fin adjacent to and contacting a sidewall of the gate;
a first epitaxial layer around the fin adjacent to and contacting a sidewall of the first spacer, the first epitaxial layer having an upper surface below an upper surface of the first spacer;
a second spacer around the first epitaxial layer adjacent to and contacting a sidewall of the first spacer, the second spacer having a bottom surface in contact with an upper surface of the first epitaxial layer; and
a second epitaxial layer on an upper surface of a substrate and around the first epitaxial layer adjacent to and contacting a sidewall of the second spacer.

16. The structure of claim 15, wherein the first spacer comprises:
a dielectric material on the upper surface of the substrate and around the fin.

17. The structure of claim 15, wherein the first epitaxial layer and the second epitaxial layer comprise an epitaxial source-drain region.

18. The structure of claim 17, wherein the epitaxial source-drain region comprises silicon germanium with a germanium concentration ranging from approximately 0 atomic percent to approximately 80 atomic percent.

19. The structure of claim 15, wherein the second spacer comprises:
a dielectric material on the upper surface of the substrate and around the first epitaxial layer.

* * * * *